(12) United States Patent
Kitagawa et al.

(10) Patent No.: US 8,803,267 B2
(45) Date of Patent: Aug. 12, 2014

(54) MAGNETORESISTIVE ELEMENT AND MAGNETORESISTIVE MEMORY

(71) Applicant: Kabushiki Kaisha Toshiba, Tokyo (JP)

(72) Inventors: Eiji Kitagawa, Yokohama (JP); Tadaomi Daibou, Yokohama (JP); Yushi Kato, Chofu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/621,998

(22) Filed: Sep. 18, 2012

(65) Prior Publication Data

US 2013/0249026 A1 Sep. 26, 2013

(30) Foreign Application Priority Data

Mar. 21, 2012 (JP) .................. 2012-063485

(51) Int. Cl.
*H01L 43/08* (2006.01)

(52) U.S. Cl.
USPC ....................................... 257/421

(58) Field of Classification Search
USPC .......................................... 257/421; 365/365
See application file for complete search history.

(56) References Cited

U.S. PATENT DOCUMENTS

| | | | |
|---|---|---|---|
| 7,920,361 B2 | 4/2011 | Yoshikawa et al. | |
| 2007/0096229 A1* | 5/2007 | Yoshikawa et al. | 257/421 |
| 2009/0067232 A1* | 3/2009 | Korenivski | 365/171 |
| 2009/0251951 A1* | 10/2009 | Yoshikawa et al. | 365/158 |
| 2010/0330394 A1 | 12/2010 | He et al. | |
| 2011/0044099 A1 | 2/2011 | Dieny | |

FOREIGN PATENT DOCUMENTS

| | | |
|---|---|---|
| JP | 2008-085170 | 4/2008 |
| JP | 2010-109208 | 5/2010 |
| JP | 2010-147213 | 7/2010 |
| WO | WO 2010/067520 | 6/2010 |

OTHER PUBLICATIONS

Office Action mailed Oct. 15, 2013, in Japanese Patent Application No. 2012-063485, filed Mar. 21, 2012 (with English Language Translation).

* cited by examiner

*Primary Examiner* — Matthew W Such
*Assistant Examiner* — Warren H Kilpatrick
(74) *Attorney, Agent, or Firm* — Oblon, Spivak, McClelland, Maier & Neustadt, L.L.P.

(57) ABSTRACT

According to one embodiment, a magnetoresistive element includes a first magnetic film having a variable magnetization direction, a second magnetic film having an invariable magnetization direction, and a magnesium oxide film provided between the first magnetic film and the second magnetic film and being in contact with both the first magnetic film and the second magnetic film, and doped with at least one element selected from a first group consisting of copper, silver, and gold.

10 Claims, 3 Drawing Sheets

| Material | Band gap [eV] |
|---|---|
| MgO | 7.8 |
| B₂O₃ | 6.2 |
| Al₂O₃ | 8.8 |
| Ga₂O₃ | 4.8 |
| In₂O₃ | 3.8 |

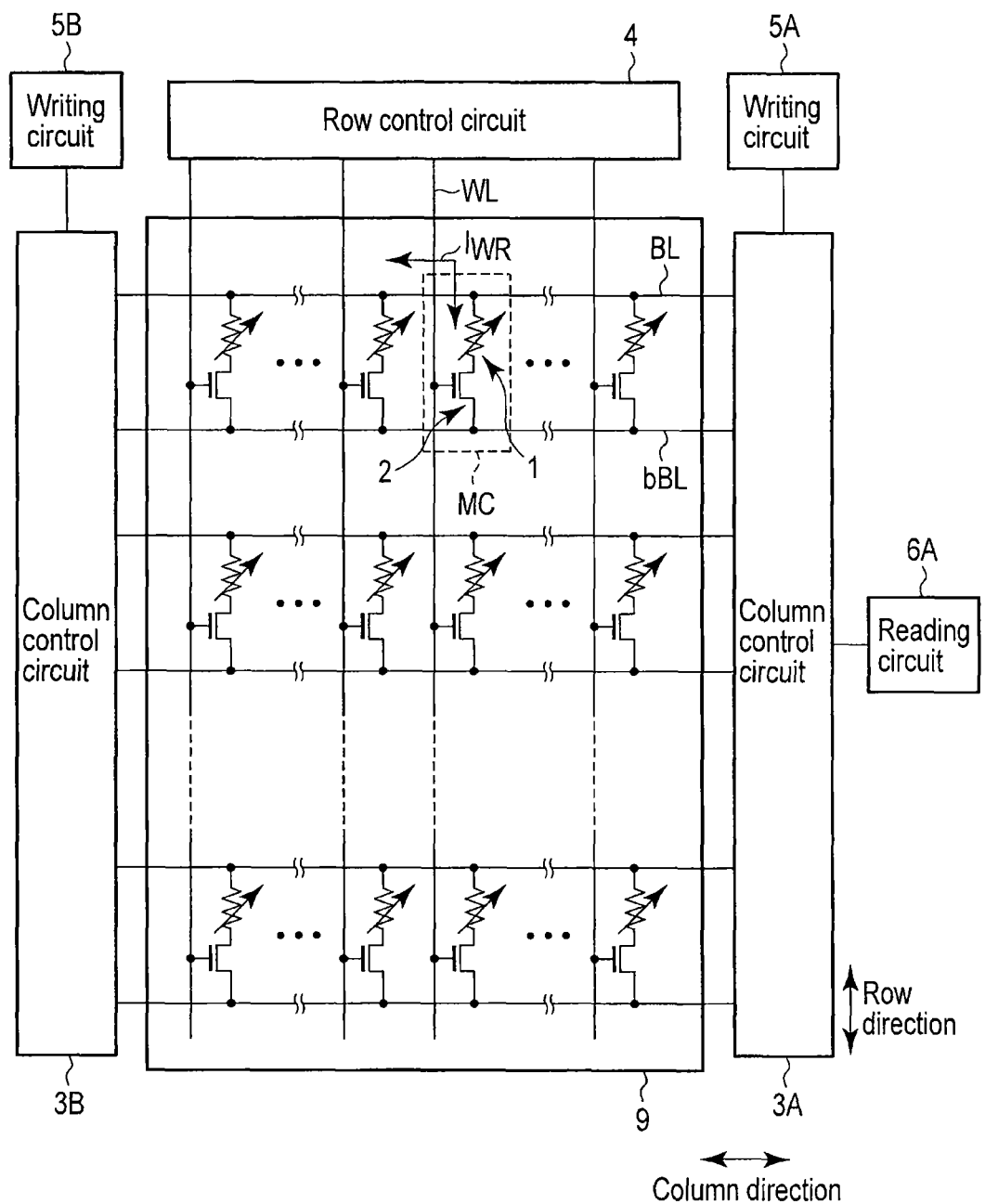
F I G. 4

MAGNETORESISTIVE ELEMENT AND MAGNETORESISTIVE MEMORY

CROSS-REFERENCE TO RELATED APPLICATIONS

This application is based upon and claims the benefit of priority from Japanese Patent Application No. 2012-063485, filed Mar. 21, 2012, the entire contents of which are incorporated herein by reference.

FIELD

Embodiments described herein relate generally to a magnetoresistive element and a magnetoresistive memory.

BACKGROUND

There have been proposed various techniques to implement a magnetic memory using a TMR (Tunnel Magneto Resistance) element.

In one method, "1" or "0" data is recorded in an MTJ (Magnetic Tunnel Junction) element in correspondence with its magnetization alignment state, and the data is read based on the difference in the resistance value of the element by the TMR effect.

As a method of writing data in a magnetic memory, that is, reversing the magnetization of the magnetic film of an MTJ element, a magnetization reversing method (to be referred to as spin transfer torque hereinafter) of flowing a spin-polarized current to an MTJ element has received a great deal of attention from the viewpoint of reducing the element size and the current value.

A magnetic memory (for example, MRAM) of the spin transfer torque method has been developed as a memory capable of reducing power consumption and increasing the speed and capacity.

BRIEF DESCRIPTION OF THE DRAWINGS

FIG. 3 is a view for explaining a magnetoresistive element according to the second embodiment; and FIGS. 4 and 5 are views showing an application example of the magnetoresistive element according to the embodiment.

DETAILED DESCRIPTION

Embodiments

Figure 1:
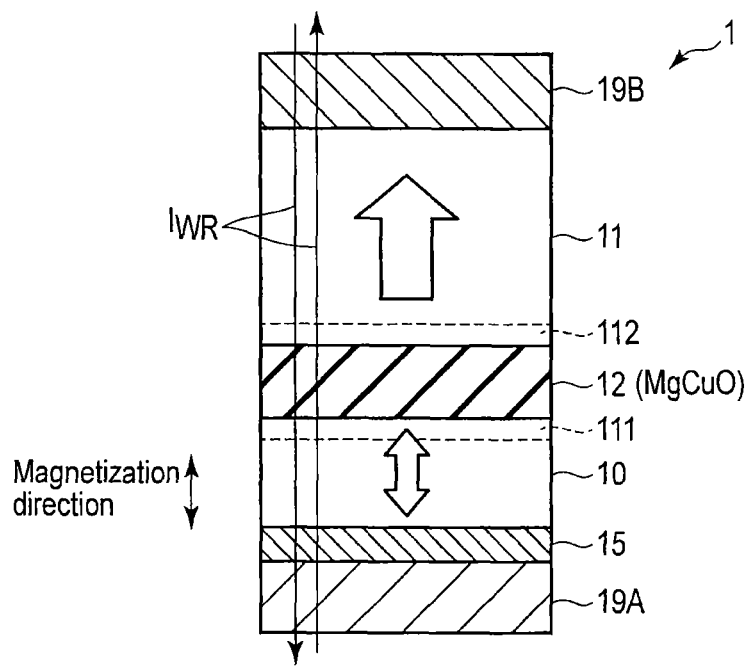
FIGS. 1 and 2 are views for explaining a magnetoresistive element according to the first embodiment.

The embodiments will now be described in detail with reference to the accompanying drawings. In the following description, the same reference numerals denote elements having the same functions and arrangements, and a repetitive description thereof will be given as needed.

In general, according to one embodiment, a magnetoresistive element includes a first magnetic film having a variable magnetization direction; a second magnetic film having an invariable magnetization direction; and a magnesium oxide film provided between the first magnetic film and the second magnetic film and being in contact with both the first magnetic film and the second magnetic film, and doped with at least one element selected from a first group consisting of copper, silver, and gold.

(1) First Embodiment

A magnetoresistive element according to the first embodiment will be described with reference to FIGS. 1 and 2.

FIG. 1 is a schematic sectional view for explaining the structure of a magnetoresistive element 1 according to this embodiment. As shown in FIG. 1, the magnetoresistive element 1 of this embodiment includes two magnetic films 10 and 11 between two electrodes 19A and 19B of the element 1.

The two magnetic films 10 and 11 have a magnetic anisotropy in a direction perpendicular to their film surfaces. The magnetizations of the two magnetic films 10 and 11 are perpendicular to their film surfaces. A magnetic film (magnetic material or magnetic layer) whose magnetization is perpendicular to the film surface will also be referred to as a perpendicular magnetization film hereinafter.

Out of the two magnetic films 10 and 11, one magnetic film 10 has a variable magnetization direction. The magnetization direction of the other magnetic film 11 is invariable (fixing). The magnetic film 10 having a variable magnetization direction will be referred to as the storage layer 10 (also called a recording layer, a free layer, or a variable magnetization layer) hereinafter. The magnetic film 11 having an invariable (fixing) magnetization direction will be referred to as the reference layer 11 (also called an invariable magnetization layer) hereinafter.

The magnetizations of the storage layer 10 and the reference layer 11 are formed by aggregates of a plurality of spins (magnetizations of magnetic particles) in the storage layer 10 and the reference layer 11.

The magnetization of the storage layer 10 is reversible. The reference layer 11 has a magnetization reversal threshold larger than that of the storage layer 10. The magnetization direction of the reference layer 11 is actually fixing.

A nonmagnetic film 12 is provided between the two magnetic films (storage layer and reference layer) 10 and 11. A magnetic tunnel junction is formed by the two magnetic films 10 and 11 and the nonmagnetic film 12 between them. The nonmagnetic film 12 will be referred to as a tunnel barrier layer 12 hereinafter.

The storage layer 10, the nonmagnetic film 12, and the reference layer 11 are stacked on a substrate (not shown). The stack structure that forms the magnetic tunnel junction is sandwiched between the two electrodes 19A and 19B in the stacking direction.

An under-layer (to be also referred to as an intermediate layer hereinafter) 15 is provided between the storage layer 10 and the electrode (to be referred to as a lower electrode hereinafter) 19A on the side of the substrate where the magnetoresistive element 1 is provided. The under-layer 15 is provided on a side of the storage layer 10 opposite to the side of the storage layer 10 where the nonmagnetic film 12 is provided. The under-layer 15 is in contact with the storage layer 10. The under-layer 15 reduces spin pumping effect between the storage layer 10 and the underlying layer 15 and lowers the damping constant of the storage layer 10. The under-layer 15 reduces the damping constant of the storage layer 10, thereby contributing to reduction of the write current.

The electrode (to be referred to as an upper electrode hereinafter) 19B is provided on the reference layer 11 on a side opposite to the substrate side where the magnetoresistive element 1 is provided. The reference layer 11 is provided between the nonmagnetic film 12 and the upper electrode 19B.

In the MTJ element 1 according to this embodiment, the relative magnetization directions of the storage layer 10 and the reference layer 11 are reversed by, for example, spin transfer torque (to be referred to as STT hereinafter).

In STT, the magnetization direction of the storage layer 10 of the MTJ element 1 is changed by the spin torque caused by a current $I_{WR}$ supplied to the MTJ element 1. That is, the magnetization direction of the storage layer 10 changes when spin-polarized electrons included in the current $I_{WR}$ supplied to the MTJ element 1 act on the magnetization (spin) of the storage layer 10.

"The magnetization direction of the reference layer is fixing" or "the magnetization direction of the reference layer is invariable" means that the magnetization direction of the reference layer 11 does not change when a current equal to or more than the magnetization reversal threshold for reversing the magnetization direction of the storage layer 10 flows to the reference layer 11.

Hence, in the MTJ element 1, a magnetic film having a large magnetization reversal threshold is used as the reference layer 11, and a magnetic film having a magnetization reversal threshold smaller than that of the reference layer 11 is used as the storage layer 10. The MTJ element 1 including the storage layer 10 having a variable magnetization direction and the reference layer 11 having a fixing magnetization direction is thus formed.

The write current $I_{WR}$ has a current value larger than the magnetization reversal threshold current of the storage layer 10 and smaller than the magnetization reversal threshold current of the reference layer 11.

When the magnetization direction of the storage layer 10 is parallel (P) to that of the reference layer 11, that is, the magnetization direction of the storage layer 10 is the same as that of the reference layer 11, the current $I_{WR}$ flowing from the storage layer 10 to the reference layer 11 is supplied to the MTJ element 1.

In this case, the electrons move from the reference layer 11 to the storage layer 10 via the nonmagnetic film 12. Out of the electrons that have moved to the storage layer 10 via the reference layer 11 and the nonmagnetic film 12, the majority of electrons (spin-polarized electrons) have the same direction as the magnetization (spin) direction of the reference layer 11. The spin momentum transfer (spin torque) of the spin-polarized electrons is applied to the magnetization (spin) of the storage layer 10, and the magnetization of the storage layer 10 changes to the same direction as the magnetization direction of the reference layer 11. When the magnetization alignment of the MTJ element 1 is parallel alignment (parallel state), the resistance value of the MTJ element 1 is minimized.

When the magnetization direction of the storage layer 10 is antiparallel (AP) to the magnetization direction of the reference layer 11, that is, the magnetization direction of the storage layer 10 is reverse to that of the reference layer 11, the current $I_{WR}$ flowing from the reference layer 11 to the storage layer 10 is supplied to the MTJ element 1.

In this case, the electrons move from the storage layer 10 to the reference layer 11. Electrons having spins antiparallel to the magnetization direction of the reference layer 11 are reflected by the reference layer 11. The reflected electrons are injected into the storage layer 10 as spin-polarized electrons. The spin torque of the spin-polarized electrons (reflected electrons) is applied to the magnetization of the storage layer 10, and the magnetization of the storage layer 10 changes to the direction reverse to the magnetization direction of the reference layer 11. When the magnetization alignment of the MTJ element 1 is antiparallel alignment (antiparallel state), the resistance value of the MTJ element 1 is maximized.

When the MTJ element 1 is used as a memory element of a magnetic memory (magnetoresistive memory), for example, the MTJ element 1 in a small resistance value state (the magnetization alignment is parallel) is associated with a "0" data holding state, and the MTJ element 1 in a large resistance value state (the magnetization alignment is antiparallel) is associated with a "1" data holding state.

When the MTJ element 1 is used as a memory element of a magnetic memory, data is written in the MTJ element 1 by STT current.

When discriminating the resistance state of the MTJ element 1 according to this embodiment, a current is supplied to the MTJ element 1, thereby determining whether the MTJ element 1 is in the "0" data holding state or "1" data holding state. The magnitude of a signal (read output or read signal) based on the current (to be referred to as a read current or resistance determination current hereinafter) flowing to the MTJ element 1 to discriminate the resistance state varies in accordance with the resistance value of the MTJ element 1. The current value of the read current is set to a value smaller than the current value (magnetization reversal threshold) of the write current $I_{WR}$ so that the magnetization of the storage layer 10 is not reversed by the read current.

As described above, when the MTJ element 1 is used as a memory element of a magnetic memory, a current is supplied to the MTJ element 1, thereby reading data stored in the MTJ element serving as a memory element.

The MTJ element 1 shown in FIG. 1 is of, for example, a top-pin type in which the nonmagnetic film 12 is stacked on the storage layer 10 above under-layer 15, and the reference layer 11 is stacked on the nonmagnetic film 12.

The perpendicular magnetic anisotropy of the magnetic films (storage layer and reference layer) 10 and 11 included in the MTJ element 1 is formed using the magnetocrystalline anisotropy of the magnetic material (magnetic films).

In the MTJ element 1 of the perpendicular magnetization type using the magnetocrystalline anisotropy, the c-axis of a crystal corresponds to the direction perpendicular to the film surface. For this reason, even if each crystal grain rotates in the in-plane direction of the film, the c-axes of the crystals remain perpendicular to the film surface and are not dispersed. Hence, the perpendicular magnetization film using the magnetocrystalline anisotropy can suppress the dispersion of the crystal axes.

An example of a material having a high magnetocrystalline anisotropy energy density is a Co—Cr alloy. The Co—Cr alloy material has a hexagonal structure and a uniaxial magnetocrystalline anisotropy having the c-axis as the axis of easy magnetization. Hence, the direction of crystal growth of the Co—Cr alloy is controlled such that the c-axes of the crystals become parallel to the direction perpendicular to the film surface in the crystal orientation of the magnetic film using the Co—Cr alloy. The dispersion of the crystal axes in the magnetic film using the magnetocrystalline anisotropy is thus suppressed. When the dispersion of the crystal axes is suppressed, the increase in the reversal threshold current is suppressed.

Similarly, even when a magnetic film having a tetragonal structure is used in the MTJ element 1, the perpendicular magnetization MTJ structure can be implemented by controlling the c-axis to be perpendicular to the film surface. As the magnetic material having a tetragonal structure, for example, a material having an $L1_0$ structure is used. Examples are an Fe—Pt ordered alloy, Fe—Pd ordered alloy, Co—Pt ordered alloy, Fe—Co—Pt ordered alloy, Fe—Ni—Pt ordered alloy, and Fe—Ni—Pd ordered alloy. When a material having an $L1_0$ structure is used as the perpendicular magnetization film, it preferably has a preferred orientation along the (001) plane as a crystal orientation.

The perpendicular magnetic anisotropy of the magnetic films 10 and 11 of the MTJ element 1 may manifest itself using the interface magnetic anisotropy of the magnetic films caused by the distortion of the interface between the stack films or the electron state in the interface. Even when the perpendicular magnetic anisotropy of the magnetic films 10 and 11 is formed by the interface magnetic anisotropy, dispersion of the crystals can be suppressed, as in the case in which the magnetocrystalline anisotropy is used to form the perpendicular magnetization film.

An example of a perpendicular magnetization film using the interface magnetic anisotropy is an artificial lattice. An example of the artificial lattice is a structure in which Co as a magnetic material and Pt (or Pd) as a nonmagnetic material are alternately stacked. Each magnetic material (layer) in the artificial lattice is preferably as a film thickness of about 0.3 to 1.0 nm to improve the magnetic anisotropy energy density. However, the thinner each layer in the artificial lattice is, the more conspicuous the spin pumping effect is, and the larger the damping constant of the artificial lattice is. Hence, when using the artificial lattice as the storage layer 10, the film thickness of each layer of the artificial lattice is preferably taken into consideration. Alternatively, using MgO (a film mainly containing MgO) for the nonmagnetic film 12 and FeB or CoFeB for the storage layer (magnetic film) enables to generate an interface magnetic anisotropy between MgO and FeB or between MgO and CoFeB and thus obtain a perpendicular magnetic anisotropy. The perpendicular magnetic anisotropy manifests itself between the nonmagnetic film 12 and the storage layer 10. It is therefore possible to suppress the anisotropic dispersion and suppress an increase in the reversal threshold current.

Considering data write to the MTJ element 1 that is a memory element using STT, the storage layer 10 is preferably formed using a material having a small damping constant.

The tunnel barrier layer (nonmagnetic film) 12 is formed from a film mainly containing magnesium oxide (MgO). MgO has a sodium chloride (NaCl) structure. When a material such as MgO having the NaCl structure is used as the tunnel barrier layer 12, the film mainly containing MgO and serving as the tunnel barrier layer 12 has a crystal orientation. For example, the crystal preferably has a preferred orientation along the fcc (001) plane (or orientation) and a plane (or orientation) equivalent to it.

Interface layers 111 and 112 may be provided near the interface between the storage layer 10 and the tunnel barrier layer 12 and near the interface between the reference layer 11 and the tunnel barrier layer 12. The interface layers 111 and 112 are magnetic films in contact with the tunnel barrier layer 12. Note that not only the magnetic films provided separately from the storage layer 10 and reference layer 11 but also portions (regions) of the storage layer 10 and reference layer 11 in contact with the tunnel barrier layer 12 may be called interface layers. The interface layers 111 and 112 relax the lattice mismatch between the tunnel barrier layer 12 and the magnetic films 10 and 11 and improve the crystallinity of the tunnel barrier layer 12 and the magnetic films 10 and 11. As a result, the characteristic (for example, MR ratio) of the MTJ element improves. For example, an interface layer is formed using a magnetic film containing at least two elements selected from the group consisting of Co (cobalt), Fe (iron), and B (boron). However, the material of the interface layer is not limited to a magnetic film containing Co, Fe, or B.

The MTJ element 1 may include a shift adjustment layer (not shown) having a magnetization in a direction reverse to the magnetization direction of the reference layer 11. The shift adjustment layer (also called a bias layer, a shift field adjustment layer, or a shift field control layer) makes a leakage magnetic field caused by the reference layer 11 almost zero, thereby suppressing shift field generation in the storage layer 10 due to the leakage field from the reference layer 11. For example, the shift adjustment layer is provided on a side (surface) of the reference layer 11 opposite to the side (surface) where the tunnel barrier layer 12 is provided.

The under-layer 15 is provided in the MTJ element 1 so as to come into contact with the storage layer 10. For example, the underlying layer 15 is provided on a side of the storage layer 10 opposite to the side where the tunnel barrier layer 12 is provided. The under-layer 15 is provided between the storage layer 10 and the lower electrode 19A. When the MTJ element 1 has a top-pin structure, the storage layer 10 is stacked on the under-layer 15. The storage layer 10 is provided between the underlying layer 15 and the tunnel barrier layer 12. To improve the magnetic characteristic of the storage layer 10, a material having a close-packed atomic plane may be used for the underlying layer 15 in accordance with the material of the storage layer 10. Alternatively, to reduce the damping constant of the storage layer 10, a material having a small spin pumping effect between the storage layer 10 and the underlying layer 15 may be used. For example, platinum (Pt), palladium (Pd), iridium (Ir), tungsten (W), tantalum (Ta), hafnium (Hf), or the like is used for the under-layer 15 as the material having a close-packed atomic plane. Alternatively, a nitride, boride, or the like is used for the underlying layer 15 as the material having a small spin pumping effect.

The upper electrode 19B of the MTJ element 1 may be used as a hard mask to work the MTJ element 1 into a predetermined shape. The lower electrode 19A may have the function of an underlying layer. The lower electrode 19A of the MTJ element 1 is provided on a substrate (not shown). For the lower electrode 19A and the upper electrode 19B, for example, tantalum (Ta), titanium (Ti), tantalum nitride (TaN), titanium nitride (TiN), or a stack film thereof is used. Ir or ruthenium (Ru) may be used for the lower electrode 19A.

A material having a small resistance value and an excellent tolerance to impurity diffusion is preferably used for the lower electrode 19A and the upper electrode 19B.

Electrodes having a stack structure such as a Ta/Cu/Ta stack film may be used as the lower electrode 19A and the upper electrode 19B. A stack film "A/B" will indicate that "A" is stacked on "B" hereinafter. For example, when Ta is used for the underlying layer 15, CoFeB/Ta/Co is used for the storage layer 10. The Co film is in contact with the Ta film serving as the underlying layer 15, and the CoFeB film of the storage layer 10 is in contact with the tunnel barrier layer 12. The Ta film between the CoFeB film and the Co film prevents impurity diffusion between the CoFeB film and the Co film. The storage layer 10 having a perpendicular magnetic anisotropy is thus formed. For example, CoFeB of the storage layer 10 is part of the storage layer 10 and also functions as the interface layer 111.

For example, to form the reference layer 11 having a perpendicular magnetic anisotropy, for example, a ferrimagnetic film (ferrimagnetic material) such as TbCoFe may be used for the reference layer 11. Providing the CoFeB film 112 serving as the interface layer between the tunnel barrier layer 12 and the TbCoFe film serving as the reference layer 11 allows to improve the MR ratio of the MTJ element.

Note that concerning the CoFeB film serving as the interface layer 111 on the side of the storage layer 10 and the CoFeB film serving as the interface layer 112 on the side of the reference layer 11, the composition ratio of Co, Fe, and B in the interface layer 111 may differ from the composition ratio of Co, Fe, and B in the interface layer 112.

Note that the MTJ element 1 of this embodiment is formed by sequentially depositing the layers 19A, 15, 10, 12, 11, and 19B on a substrate by PVD or the like and working them using ion milling, RIE, or the like.

In this embodiment, an MgO film doped with Cu is provided between the storage layer 10 and the reference layer 11 as the tunnel barrier layer 12 of the MTJ element 1.

For example, Cu (for example, $Cu^{2+}$) is doped into the MgO film lattice-displaces Mg ($Mg^{2+}$) in the crystal lattice of MgO. In some cases, some Cu ions doped into the MgO film exist as monovalent Cu ions ($Cu^+$) in the film, and the $Cu^+$ lattice-displaces in MgO. MgO doped with Cu will be referred to as MgCuO hereinafter.

The MgCuO film 12 is in contact with the storage layer 10 and the reference layer 11. When the storage layer 10 and the reference layer 11 include the interface layers 111 and 112, the MgCuO film 12 is in contact with the interface layers (for example, CoFeB) 111 and 112.

Preferably, Cu doped into the MgO film does not cause segregation to the surfaces of the MgO film (near the interfaces between the tunnel barrier layer 12 and the magnetic layers 10 and 11). That is, preferably, no Cu layer is formed on the interfaces between the tunnel barrier layer 12 and the magnetic films.

Figure 2:
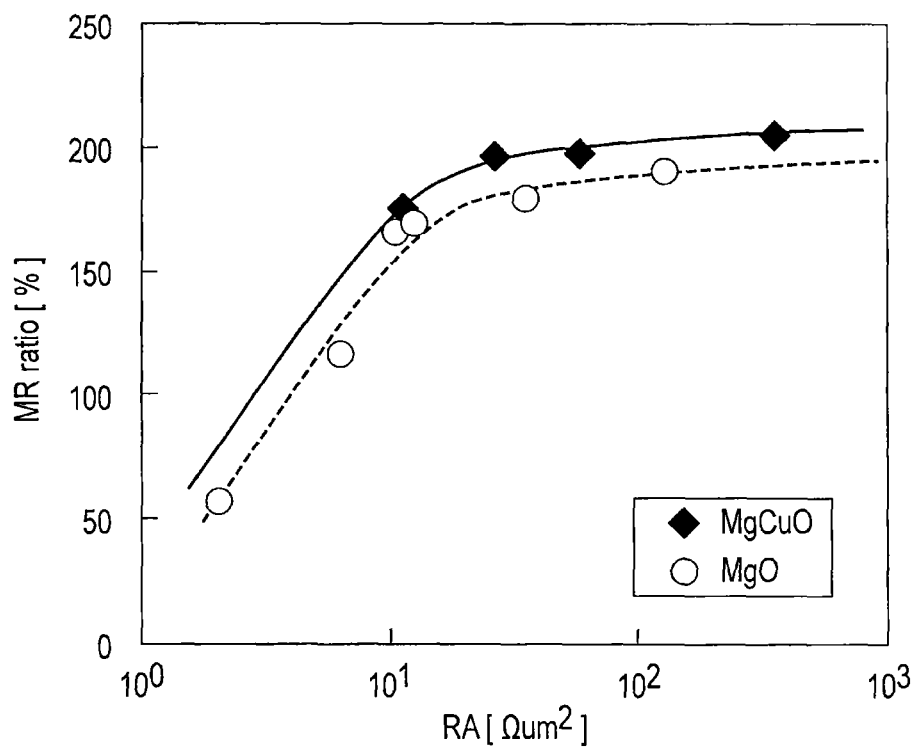

FIG. 2 is a graph showing the MR ratio of the magnetic tunnel junction film (MTJ film). The abscissa of the graph of FIG. 2 corresponds to the resistance value (unit: $\Omega \cdot \mu m^2$) of the MTJ film, and the ordinate of the graph of FIG. 2 corresponds to the MR ratio (unit: %) of the MTJ film.

The MTJ film used to measure the MR ratio has a structure (CoFeB/MgCuO/CoFeB) including a tunnel barrier layer formed from an MgCuO film and sandwiched between two CoFeB films.

FIG. 2 also shows the relationship between the MR ratio and the resistance of a structure (CoFeB/MgO/CoFeB) including an MgO film that is not doped with Cu and that is provided between the CoFeB films for comparison with the MTJ film using the MgCuO film.

Referring to FIG. 2, as for the composition ratio of the MgCuO film of the MTJ film, about 1 at % (atomic %) of Cu is doped into MgO whose composition ratio of Mg and O is 1:1.

As shown in FIG. 2, concerning each of the resistances (RA: Resistance-Area Product) of MTJ films normalized per unit area, the MTJ film of this embodiment having the CoFeB/MgCuO/CoFeB structure has a higher MR ratio than that of the MTJ film having the CoFeB/MgO/CoFeB structure. When Cu is doped into the MgO serving as the tunnel barrier layer, the MR ratio of the MTJ element improves by about 20% as compared to MgO that is not doped with Cu.

As described above, the MR ratio of the MTJ element can be improved by doping Cu into the MgO serving as the tunnel barrier layer.

When Cu is doped into MgO, a copper oxide formed from Cu and O (oxygen) of MgO acts like a semiconductor. The band gap of copper oxide (for example, CuO) is about 1.2 eV, which is smaller than that (7.8 eV) of MgO. For this reason, the band gap of MgCuO becomes smaller than that of MgO in accordance with the amount of Cu doped into MgO.

The resistance value (electrical resistance) of the tunnel barrier layer lowers due to the copper oxide that acts like a semiconductor. Hence, when the MgCuO film and the MgO film are compared for the same resistance value, the film thickness of the MgCuO film is larger than that of the MgO film.

For example, when the resistance value RA of the MTJ film is set to about 10 $\Omega \cdot \mu m^2$, the film thickness of the MgO serving as the tunnel barrier layer is about 1.1 nm. On the other hand, the film thickness of MgCuO containing 1 at % of Cu and serving as the tunnel barrier layer is about 1.2 nm.

When the film thickness of the tunnel barrier layer 12 mainly containing MgO increases, the absolute value of a nucleation energy AG for stabilizing the crystal nucleus of the fcc (001) plane (or a plane equivalent to it) of MgO increases. Since the film mainly containing MgO can be made thick by doping Cu, the fcc (001) plane of MgO with an excellent crystal orientation can be generated. As a result, an MTJ film having a high MR ratio can be formed because of the improved crystallinity of the tunnel barrier layer, as shown in FIG. 2. Note that the same MR ratio can be obtained by using the MTJ film as the MTJ element 1 shown in FIG. 1.

The spin diffusion length of Cu is 100 nm or more, which is much longer than that of a magnetic metal (for example, Co or Fe). When Cu is doped into MgO, the spin information of electrons is held even in the tunnel barrier layer 12 using MgCuO.

As described above, even when Cu is doped into MgO as an impurity, degradation of the tunnel barrier layer 12 mainly containing MgO is suppressed, and the decrease in the MR ratio of the MTJ element caused by the impurity in the tunnel barrier layer 12 does not occur.

However, when the amount of Cu doped into MgO is increased, the Cu dependence of the crystal in the film increases, and the crystal structure of the (001) plane of MgO is distorted.

If the concentration of Cu doped into MgO exceeds a predetermined value, the tunnel barrier layer made of MgCuO degrades, and the MR ratio of the MTJ element lowers. Hence, the concentration of Cu doped into MgO is preferably 10 at % or less. Note that the concentration of Cu doped into MgO is preferably 1 at % or more.

In place of Cu, silver (Ag) or gold (Au) belonging to the same group 11 may be doped into MgO. Even when Ag or Au is doped into MgO, the same effect as that obtained upon doping Cu into MgO can be obtained. However, even when Ag or Au is doped into the MgO film, if the amount of doped Ag or Au is excessive, the crystal structure of MgO is distorted, as in the case in which Cu is doped. For this reason, the doping amount of Ag or Au into MgO is preferably 10 at % or less. Note that two or more elements selected from the group (group 11 elements) consisting of Cu, Ag, and Au may be doped into MgO serving as the tunnel barrier layer 12.

When MgO is used for the tunnel barrier layer between the magnetic films of the MTJ element, the presence/absence of an Δl band formed in the MgO acts on the magnitude of the MR ratio of the MTJ element.

When MgO has a crystal orientation along the (001) plane (and a plane equivalent to it), and the magnetization directions of the two magnetic films sandwiching the MgO are parallel, Δl band is formed in the MgO, and the resistance value of the MTJ element (magnetic tunnel junction) decreases. On the other hand, when the magnetization directions of the two magnetic films sandwiching the MgO are antiparallel, the Δl band disappears at the Fermi level, and the resistance value of the MTJ element (magnetic tunnel junction) increases. As described above, the crystallinity of the tunnel barrier layer using MgO depends on the magnitude of the MR ratio (resistance ratio) of the MTJ element.

For this reason, forming an MgO film of high quality (high crystallinity) is preferable in forming an MTJ element having a high MR ratio.

Development of a magnetic memory (for example, MRAM) using an MTJ element as a memory element preferably goes hand in hand with a reduction of power consumption and cost by element downsizing that has been driven by silicon devices. For this reason, from the viewpoint of downsizing elements and reducing the power consumption of a memory, the tunnel barrier layer made of MgO preferably has a small resistance value.

For example, if an MRAM as a general-purpose 1-Gbit memory is aimed at, the resistance value RA of the tunnel barrier layer made of MgO is about 10 $\Omega \cdot \mu m^2$. In this case, the film thickness of the MgO serving as the tunnel barrier layer is about 1 nm.

However, when the film thickness of the MgO film is about 1 nm, the absolute value of the nucleation energy becomes small. Since the crystal nucleus of MgO is hard to form, crystallization of the fcc (001) plane (or a plane equivalent to it) of MgO is impeded. As a result, formation of a high-quality MgO film becomes difficult, and the decrease in the MR ratio of the MTJ element becomes prominent as the element becomes smaller (MgO becomes thinner).

When the MR ratio of the MTJ element lowers, it is difficult to discriminate between the high-resistance state and the low-resistance state of the MTJ element and read data from the MTJ element serving as a memory element. If the storage capacity of the MRAM increases, the variation between the MTJ elements may be large. The variation between the MTJ elements makes data discrimination corresponding to the resistance state of the MTJ element more difficult. In addition, as the MR ratio of the MTJ element lowers, the write current of the MTJ element increases, and power consumption increases.

When Cu is doped into MgO serving as the tunnel barrier layer 12, as in this embodiment, the resistance of the tunnel barrier layer 12 mainly containing MgO can be made lower, and the film thickness of the tunnel barrier layer 12 mainly containing MgO can be made larger. It is therefore possible to form the tunnel barrier layer 12 having a low resistance and mainly containing high-quality MgO and thus improve the MR ratio of the MTJ element.

As a consequence, a large resistance difference is generated between the high-resistance state and the low-resistance state of the MTJ element, and the data of the MTJ element serving as a memory element can relatively easily be discriminated.

As described above, the magnetoresistive element of the first embodiment can improve the element characteristics.

(2) Second Embodiment

A magnetoresistive element according to the second embodiment will be described with reference to FIG. 3. In the MTJ element of this embodiment, the same reference numerals as in the magnetoresistive element of the first embodiment denote components having the same arrangements, and a description thereof will be made as needed.

The magnetoresistive element of the second embodiment actually has the same structure as that shown in FIG. 1 except that the material used for the tunnel barrier layer is different from that of the first embodiment. Hence, the structure according to the second embodiment will be explained with reference to FIG. 1.

In the first embodiment, an MTJ element using an MgO film doped with Cu as a tunnel barrier layer 12 has been described.

In place of Cu, an element (dopant serving as a donor or an acceptor) that gives MgO n- or p-type conductivity may be doped into the tunnel barrier layer 12 containing MgO.

In the MgO film, doped trivalent or monovalent positive ions lattice-displace Mg that forms bivalent positive ions. The MgO film thus obtains n- or p-type conductivity. Since a donor level or an acceptor level is formed in the band gap of MgO due to the doped element (ions), MgO changes to an n or p type. When MgO changes to an n or p type, the resistance value of the MgO film decreases. The MgO film doped impurity (n or p type dopant) becomes semi-conductive layer. Note that a defect at a deeper level may be formed in the band gap of MgO due to the doped impurity.

For example, at least one element selected from the group consisting of boron (B), aluminum (Al), gallium (Ga), and indium (In) may be doped into the tunnel barrier layer 12 mainly containing MgO as a dopant that gives MgO conductivity in place of Cu. B, Al, Ga, and In form trivalent positive ions.

Figures 3, 5:
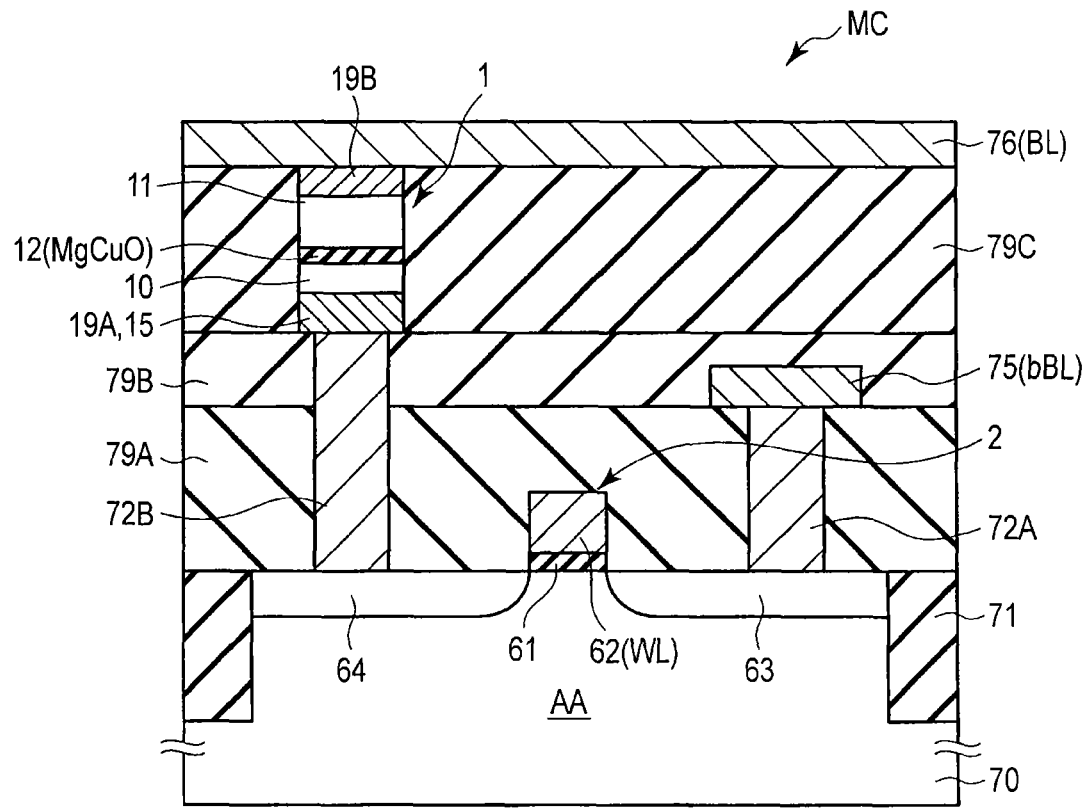

FIG. 3 shows the band gaps of oxides formed from impurities doped into MgO.

As shown in FIG. 3, a B oxide (for example, $B_2O_3$) has a band gap of about 6.2 eV. A Ga oxide (for example, $Ga_2O_3$) has a band gap of about 4.8 eV. An In oxide (for example, $In_2O_3$) has a band gap of about 3.8 eV. The band gaps of these oxides are smaller than that of MgO. However, an Al oxide (for example, $Al_2O_3$) has a band gap of 8.8 eV which is larger than that of MgO.

When an element that forms an oxide having a band gap smaller than that of MgO is doped into MgO, the band gap of the MgO doped with the element becomes smaller than that of MgO that is not doped with an impurity.

Like Cu, if the amount of an impurity such as In or Ga doped into MgO is excessive, the crystal structure of MgO is distorted. Hence, even when an impurity serving as a donor or an acceptor is doped into MgO, the impurity concentration in the MgO film serving as the tunnel barrier layer 12 is preferably set to 10 at % or less.

In general, the spin relaxing time is short in an n-type semiconductor. Hence, if a large amount of impurity (donor impurity) serving as a donor is doped into MgO, the current spin is relaxed in the tunnel barrier layer. For this reason, a p-type dopant that causes less spin relaxation than an n-type dopant is preferably used as a dopant to lower the resistance of MgO. However, when doping a p-type dopant into MgO of the tunnel barrier layer 12 to lower its resistance, the amount of the p-type dopant (acceptor impurity) to be doped into MgO of the tunnel barrier layer 12 to suppress spin relaxation is preferably 3 at % or less and, more preferably, 1 at % or less.

Note that B, Al, Ga, and In may be doped into an MgCuO film serving as the tunnel barrier layer 12. In this case, the concentrations of B, Al, Ga, and In in the MgCuO film are preferably lower than the concentration of Cu in the MgCuO film.

As described above, when MgO is changed to a semiconductor (n type/p type) by doping a donor impurity/acceptor impurity into MgO, the resistance of the tunnel barrier layer 12 containing MgO lowers, and the film thickness of the tunnel barrier layer 12 mainly containing MgO can increase. This allows to form a tunnel barrier layer mainly containing high-quality MgO in the magnetoresistive element of this embodiment, as in the first embodiment. For this reason, the MTJ element of the second embodiment can improve the MR ratio.

As described above, the magnetoresistive element of the second embodiment can improve the element characteristics.

(3) Application Example

An application example of the magnetoresistive element according to the embodiment will be described with reference to FIGS. 4 and 5. Note that the same reference numerals as in the above-described embodiment denote the same components, and a description thereof will be made as needed.

The magnetoresistive element of the above-described embodiment is used as a memory element of a magnetic memory, for example, an MRAM (Magnetoresistive Random Access Memory). In this application example, an STT MRAM (Spin-torque transfer MRAM) will be exemplified.

FIG. 4 is a block diagram showing a memory cell array of this application example and a circuit arrangement in the vicinity thereof.

As shown in FIG. 4, a memory cell array 9 includes a plurality of memory cells MC.

The plurality of memory cells MC are arranged as an array in the memory cell array 9. A plurality of bit lines BL and bBL and a plurality of word lines WL are provided in the memory cell array 9. The bit lines BL and bBL run in the column direction. The word lines WL run in the row direction. The two bit lines BL and bBL form a bit line pair.

The memory cells MC are connected to the bit lines BL and bBL and the word lines WL.

The plurality of memory cells MC arrayed in the column direction are connected to the common pair of bit lines BL and bBL. The plurality of memory cells MC arrayed in the row direction are connected to the common word line WL.

Each memory cell MC includes, for example, one magnetoresistive element (MTJ element) 1 serving as a memory element and one select switch 2. The magnetoresistive element (MTJ element) 1 described in the first or second embodiment is used as the MTJ element 1 in the memory cell MC.

The select switch 2 is, for example, a field effect transistor. The field effect transistor serving as the select switch 2 will be referred to as the select transistor 2 hereinafter.

The MTJ element 1 has one terminal connected to the bit line BL and the other terminal connected to one end (source/drain) of the current path of the select transistor 2. The other end (drain/source) of the current path of the select transistor 2 is connected to the bit line bBL. The control terminal (gate) of the select transistor 2 is connected to the word line WL.

One end of each word line WL is connected to a row control circuit 4. The row control circuit 4 controls activation/inactivation of the word lines based on an external address signal.

Column control circuits 3A and 3B are connected to one end and the other end of each of the bit lines BL and bBL. The column control circuits 3A and 3B control activation/inactivation of the bit lines BL and bBL based on an external address signal.

Writing circuits 5A and 5B are connected to one end and the other end of each of the bit lines BL and bBL via the column control circuits 3A and 3B. The writing circuits 5A and 5B include a source circuit such as a current source or voltage source to generate a write current and a sink circuit to absorb the write current, respectively.

In the STT MRAM, at the time of data write, the writing circuits 5A and 5B supply a write current to an externally selected memory cell (to be referred to as a selected cell hereinafter).

When writing data to the MTJ element 1, the writing circuits 5A and 5B bidirectionally supply a write current to the MTJ element 1 in the memory cell MC in accordance with data to be written to the selected cell. That is, the writing circuits 5A and 5B output a write current from the bit line BL to the bit line bBL or a write current from the bit line bBL to the bit line BL in accordance with data to be written to the MTJ element 1.

A reading circuit 6A is connected to one end of each of the bit lines BL and bBL via the column control circuit 3A. The reading circuit 6A includes a current source or voltage source to generate a read current, a sense amplifier that detects and amplifies a read signal, and a latch circuit for temporarily holding data. When reading data from the MTJ element 1, the reading circuit 6A supplies a read current to the selected cell. The current value of the read current is smaller than the current value (magnetization reversal threshold) of the write current so the magnetization of the recording layer is not reversed by the read current.

The current value or potential of the read node changes depending on the magnitude of the resistance value of the MTJ element 1 to which the read current is supplied. Data stored in the MTJ element 1 is discriminated based on a variation amount (read signal, read output) corresponding to the magnitude of the resistance value.

In the example shown in FIG. 4, the reading circuit 6A is provided on one end side in the column direction. However, two reading circuits may be provided at one end and the other end, respectively.

For example, circuits (to be referred to as peripheral circuits hereinafter) other than the row/column control circuits, the writing circuits, and the reading circuit are provided in the same chip as that of the memory cell array 9. For example, a buffer circuit, a state machine (control circuit), or an ECC (Error Checking and Correcting) circuit may be provided in the chip as a peripheral circuit.

FIG. 5 is a sectional view showing an example of the structure of the memory cell MC provided in the memory cell array 9 of the MRAM of this application example.

The memory cell MC is formed in an active region AA of a semiconductor substrate 70. The active region AA is defined by an insulating film 71 buried in the element isolation region of the semiconductor substrate 70. Inter-layer insulating films 79A, 79B and 79C are stacked on the semiconductor substrate 70. The MTJ element 1 is provided on the inter-layer insulating films 79A, 79B as the substrate.

The upper end of the MTJ element 1 is connected to a bit line 76 (BL) via an upper electrode 19B. The bit line 76 is provided on the inter-layer insulating films 79C covering the MTJ element 1. The lower end of the MTJ element 1 is connected to a source/drain diffusion layer 64 of the select transistor 2 via a lower electrode 19A and a contact plug 72B in the inter-layer insulating films 79A, 79B. A source/drain diffusion layer 63 of the select transistor 2 is connected to a bit line 75 (bBL) via a contact plug 72A in the inter-layer insulating film 79A.

A gate electrode 62 is formed on a gate insulating film 61 on the surface of the active region AA between the source/drain diffusion layer 64 and the source/drain diffusion layer 63. The gate electrode 62 runs in the row direction and is used as the word line WL.

The MTJ element 1 is formed immediately above the contact plug 72B. However, it may be arranged at a position (for example, above the gate electrode of the select transistor) shifted from immediately above the contact plug using an intermediate interconnection layer.

FIG. 5 illustrates an example in which one memory cell is provided in one active region AA. However, two memory cells may be provided in one active region AA so as to be adjacent in the column direction while sharing one bit line bBL and the source/drain diffusion layer 63. The cell size of the memory cell MC is thus reduced.

FIG. 5 shows a field effect transistor having a planar structure as the select transistor 2. However, the structure of the field effect transistor is not limited to this. For example, a field effect transistor having a 3D structure such as an RCAT (Recess Channel Array Transistor) or Fin FET may be used as the select transistor. In the RCAT, the gate electrode is buried on a gate insulating film in a trench (recess) in a semiconductor region. In the Fin FET, the gate electrode and a strip-shaped semiconductor region (fin) cross each other on different levels while sandwiching a gate insulating film between them.

The MTJ element 1 of the first embodiment is used as a memory element of the MRAM. The MTJ element 1 in the memory cell MC uses an MgCuO film as the tunnel barrier layer 12. This allows to improve the crystallinity of the tunnel barrier layer 12 mainly containing MgO.

Note that the MgCuO film of the tunnel barrier layer 12 may further be doped with at least one of Ag, Au, B, Al, Ga, and In. The tunnel barrier layer 12 may be an MgO film doped with at least one of Ag, Au, B, Al, Ga, and In in place of Cu.

Using the MgCuO film as the tunnel barrier layer 12 allows to increase the MR ratio of the MTJ element 1. In addition, doping a donor/acceptor dopant so as to use an n-/p-type MgO film as the tunnel barrier layer 12 allows to increase the MR ratio of the MTJ element 1.

For this reason, the data read characteristic of the MRAM can be improved by forming the MRAM using the MTJ element according to the first or second embodiment.

Hence, the magnetic memory including the magnetoresistive element of the embodiment can improve the operation characteristic.

Other Embodiments

In the magnetoresistive element of the above-described embodiment, a perpendicular magnetization film has been exemplified. However, the above-described effect can be obtained even when a parallel magnetization film (in-plane magnetization film) having a magnetization direction parallel to the film surface is used as each of the magnetic films of the storage layer and the reference layer sandwiching MgCuO as long as the MgO serving as the tunnel barrier layer is doped with Cu. The parallel magnetization film may be used as each of the storage layer and the reference layer even when the tunnel barrier layer mainly containing MgO is doped with Ag, Au, B, Ga, or In in addition to or independently of Cu (without doping Cu).

The magnetoresistive element according to the first or second embodiment may be applied to a magnetic memory other than an MRAM. A magnetic memory using the magnetoresistive element according to the first or second embodiment is used as an alternate memory such as a DRAM or SRAM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
a first magnetic film having a variable magnetization direction;
a second magnetic film having an invariable magnetization direction; and
a magnesium oxide film provided between the first magnetic film and the second magnetic film and doped with at least one element selected from a first group consisting of gallium and indium.

2. The element according to claim 1, wherein a concentration of the one element selected from the first group in the magnesium oxide film is not more than 10 at %.

3. The element according to claim 1, wherein the magnesium oxide film is further doped with at least one element selected from a second group consisting of copper, silver, and gold.

4. The element according to claim 1, wherein a band gap of the magnesium oxide film is smaller than 7.8 eV.

5. The element according to claim 1, wherein the magnesium oxide film has a preferred orientation along an fcc (001) plane and a plane equivalent to the fcc (001) plane.

6. The element according to claim 1, wherein each of the first magnetic film and the second magnetic film has a magnetization perpendicular to film surfaces of the first magnetic film and the second magnetic film.

7. The element according to claim 1, wherein each of the first magnetic film and the second magnetic film has a magnetization parallel to film surfaces of the first magnetic film and the second magnetic film.

8. The element according to claim 1, wherein
the first magnetic film includes a first interface layer being in contact with the magnesium oxide film and containing at least two of cobalt, iron, and boron, and
the second magnetic film includes a second interface layer being in contact with the magnesium oxide film and containing at least two of cobalt, iron, and boron.

9. A magnetoresistive memory comprising
a memory cell including the magnetoresistive element according to claim 1.

10. The element according to claim 1, wherein the magnesium oxide film is further doped with at least one element selected from a second group consisting of aluminum and boron.

* * * * *